United States Patent
Shahzad et al.

(10) Patent No.: US 10,598,753 B2
(45) Date of Patent: Mar. 24, 2020

(54) GPU BASED IMPLEMENTATION OF SENSE (A PARALLEL MRI ALGORITHM) USING LEFT INVERSE METHOD

(71) Applicant: COMSATS Institute of Information Technology, Islamabad (PK)

(72) Inventors: Hassan Shahzad, Islamabad (PK); Irfanullah, Islamabad (PK); Hammad Omer, Islamabad (PK)

(73) Assignee: COMSATS Institute of Information Technology, Islamabad (PK)

( * ) Notice: Subject to any disclaimer, the term of this patent is extended or adjusted under 35 U.S.C. 154(b) by 234 days.

(21) Appl. No.: 15/629,500

(22) Filed: Jun. 21, 2017

(65) Prior Publication Data

US 2017/0371020 A1    Dec. 28, 2017

(30) Foreign Application Priority Data

Jun. 22, 2016  (PK) .................................... 379/2016

(51) Int. Cl.
*G01R 33/561*  (2006.01)

(52) U.S. Cl.
CPC ................ *G01R 33/5611* (2013.01)

(58) Field of Classification Search
CPC .............. G01R 33/543; G01R 33/5608; G01R 33/4828
USPC .......................... 324/307, 309, 318, 322, 314
See application file for complete search history.

(56) References Cited

U.S. PATENT DOCUMENTS

| 7,423,430 B1* | 9/2008 | Sharif .............. G01R 33/56325 324/309 |
| 9,400,319 B2* | 7/2016 | Ito ......................... G01R 33/246 |
| 2009/0285463 A1* | 11/2009 | Otazo .................... G06T 3/4053 382/131 |
| 2011/0044524 A1* | 2/2011 | Wang ..................... G01R 33/54 382/131 |
| 2011/0255572 A1* | 10/2011 | Giannakis ........... H04L 25/0206 375/146 |
| 2016/0071291 A1* | 3/2016 | Samsonov ............. A61B 5/055 600/410 |
| 2017/0307716 A1* | 10/2017 | De Weerdt ......... G01R 33/4824 |
| 2018/0246178 A1* | 8/2018 | Wang .................... G01R 33/246 |

OTHER PUBLICATIONS

Pruessmann et al., "SENSE: Sensitivity Encoding for Fast MRI", Magnetic Resonance in Medicine, 1999, p. 952-962, vol. 42, Wiley-Liss, Inc.
Larkman et al., "Parallel magnetic resonance imaging", Physics in Medicine and Biology, 2007, R15-R55, vol. 52, IOP Publishing Ltd, UK.
Hansen et al., "Cartesian SENSE and k-t SENSE Reconstruction Using Comodity Graphics Hardware", Magnetic Resonance in Medicine, 2008, p. 463-468, vol. 59, Wiley InterScience, Online.

(Continued)

*Primary Examiner* — Patrick Assouad
*Assistant Examiner* — Taqi R Nasir
(74) *Attorney, Agent, or Firm* — H.C. Park & Associates, PLC

(57) ABSTRACT

A method including: constructing coil sensitivity encoding matrix; inversing of the coil sensitivity encoding matrix using Left Inverse method; and multiplying inverse of coil sensitivity encoding matrix with an under-sampled data matrix using a GPU residing on a host computer.

7 Claims, 12 Drawing Sheets

(56) References Cited

OTHER PUBLICATIONS

"Left and right inverses; pseudoinverse", MIT OpenCourseWare, Available: http://ocw.mit.edu/courses/mathematics/18-06sc-linear-algebra-fall-2011/positive-definite-matrices-and-applications/left-and-right-inverses-pseudoinverse/MIT18_06SCF11_Ses3.8sum.pdf, Accessed Mar. 2015, Online.

Omer et al., "A Graphical Generalized Implementation of SENSE Reconstruction Using Matlab", Concepts in Magnetic Resonance Part A, 2010, p. 178-186, vol. 36A(3), Wiley InterScience, Online.

Robson et al., "Comprehensive Quantification of Signal-to-Noise Ratio and g-Factor for Image-Based and k-Space-Based Parallel Imaging Reconstructions", Magnetic Resonance in Medicine, 2008, p. 895-907, vol. 60, Wiley InterScience, Online.

\* cited by examiner

GPU BASED IMPLEMENTATION OF SENSE (A PARALLEL MRI ALGORITHM) USING LEFT INVERSE METHOD

CROSS-REFERENCE TO RELATED APPLICATION

This application claims priority from and the benefit of Pakistani Provisional Patent Application No. 379/2016, filed on Jun. 22, 2016, which is hereby incorporated by reference for all purposes as if fully set forth herein.

BACKGROUND

Field

Magnetic Resonance Imaging (MM) is a powerful diagnostic imaging modality and has a large number of variable contrast mechanisms. It is a safe, non-ionizing and powerful imaging modality to visualize tissue information. The main limitation of MRI is its long data acquisition time. Parallel MRI has recently emerged as an important mechanism to reduce MM is scan time. SENSE is the most popular Parallel MRI algorithm that work in image domain. SENSE uses receiver coil sensitivity information to reconstruct the fully sampled image from the under-sampled data. The reconstruction process in SENSE is computationally intensive and encloses inherent parallelism. At the heart of SENSE algorithm is to compute a large number of matrix inversions of the encoding matrices.

Discussion of the Background

Graphical Processing Units (GPUs) using Compute Unified Device Architecture (CUDA) can be used to exploit the inherent parallelism present in MRI reconstruction algorithms to further reduce the scan time. In recent years GPUs are chosen for fast and efficient implementation of MRI reconstruction algorithms using parallel computing. Several research groups have published their results using GPUs. GPU helps a lot in reducing the time for MR image reconstruction due to its ability to execute the tasks in parallel.

According to exemplary embodiments, a GPU based design is used for SENSE and its performance is compared with CPU implementation. Specifically, one embodiment is to solve the matrix inversion problem and it uses Left Inverse Method for rectangular matrix inversions on GPU as compared to which uses Cholesky decomposition for rectangular matrix inversion. Two scenarios exist about the encoding matrix: (1) the number of receiver coils is equal to the acceleration factor which requires the inversion of a square matrix; (2) the number of receiver coils is greater than the acceleration factor which requires the inversion of a rectangular matrix whose number of rows is greater than the number of columns. Normally MRI scanners use more receiver coils as compared to the acceleration factor to improve the reconstructed image quality and to reduce noise. The "left inverse" method is used to invert the rectangular matrix for SENSE reconstruction when the number of receiver coils is greater than the acceleration factor.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method including: constructing coil sensitivity encoding matrix; inversing of the coil sensitivity encoding matrix using Left Inverse method; and multiplying the inverse of coil sensitivity encoding matrix with an under-sampled data matrix using a Graphical Processing Unit (GPU) residing on a host computer.

The method may be implemented on GPU to exploit maximum parallelism using a parallel approach.

The method may further includes computing all independent tasks on GPU by utilizing a maximum number of threads as per required number of encoding matrix inversions in SENSE.

The under-sampled data may be acquired by skipping k-space lines.

The step of inversion of coil sensitivity information may be performed to reconstruct Magnetic Resonance (MR) images.

The method may include reconstructing Magnetic Resonance (MR) images from the under-sampled data acquired from MM scanner having multiple receiver coils.

When applying the method, an acceleration factor may be less than the number of multiple receiver coils.

When applying the method, MR signals may be used and may be acquired by Cartesian sampling.

A system may include a Magnetic Resonance Image (MRI) scanner and a computer comprising the GPU, wherein the data acquired from the MM scanner is processed by the GPU by applying the method.

A system may include a Magnetic Resonance Image (MRI) scanner and the host computer comprising a central processing unit (CPU) and the GPU, wherein the data acquired from the MRI scanner is processed by the CPU and the GPU by applying the method.

Yet another exemplary embodiment provides a method includes: constructing coil sensitivity encoding matrix; inversing of the coil sensitivity encoding matrix using Left Inverse method; and multiplying the inverse of the coil sensitivity encoding matrix with an under-sampled data using a GPU that resides on the host computer to exploit maximum parallelism.

The under-sampled data may be acquired by skipping k-space lines.

The method may be used to reconstruct Magnetic Resonance (MR) images from the under-sampled data acquired from MRI scanner having multiple receiver coils.

When applying the method, an acceleration factor may be less than the number of the multiple receiver coils.

When applying the method, MR signals may be used and may be acquired by Cartesian sampling.

The method may utilize maximum possible threads to compute all independent tasks.

The method may include reconstructing Magnetic Resonance (MR) images by performing the inversion of coil sensitivity information.

A system may include: an MM scanner and a host computer comprising the GPU, wherein the data acquired from the MRI scanner is processed by the GPU by applying the method.

Additional aspects will be set forth in the detailed description which follows, and, in part, will be apparent from the disclosure, or may be learned by practice of the inventive concept.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF ILLUSTRATED EMBODIMENTS

Figure 1A:
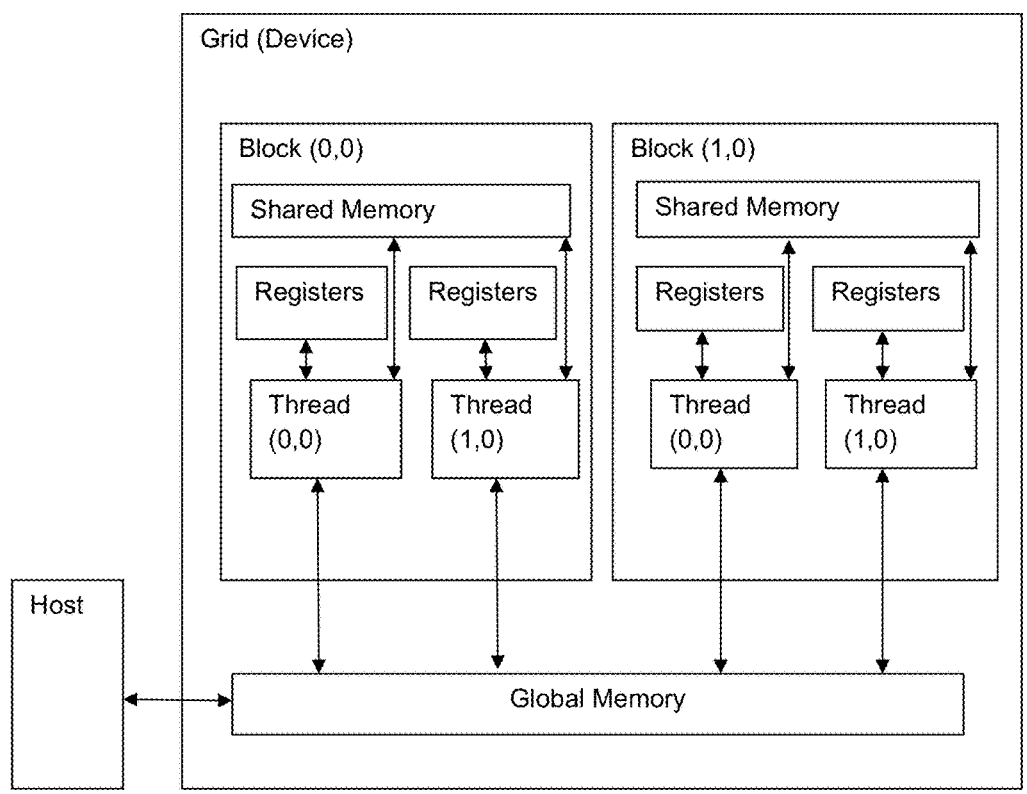
FIG. 1A is an overview of CUDA Memory Model.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

In exemplary embodiments, modules and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, modules and/or one or more components thereof may include or otherwise be associated with one or more memories (not shown) including code (e.g., instructions) configured to cause modules, processors, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

The idea behind SENSE is to reconstruct a un-aliased image from under-sampled data using the sensitivity encoding matrix obtained from the receiver coils. To implement SENSE, certain requirements need to be fulfilled: (1) coils sensitivity maps must be known, which may be obtained using Pre-scan method, (2) For accelerating the data acquisition in MRI, some phase encoding steps need to be skipped. The skipped phase encoding steps (k-space lines) decide the acceleration factor which affects the field of view (FOV).

The SENSE equation is given as:

$$M = [(C^t \psi^{-1} C)^{-1} \psi^{-1}] I \quad \text{Equation 1}$$

Where M is the image matrix to be reconstructed, C is the encoding matrix, ψ is the noise correlation matrix, I is the aliased image matrix. SENSE reconstruction algorithm requires inverting large number of independent small encoding matrices (C) which is time consuming if done sequentially. However, GPUs can be used to perform this task in parallel thus reducing the time for SENSE reconstruction. Also, MR signals are used and are acquired by Cartesian sampling.

Figure 1B:
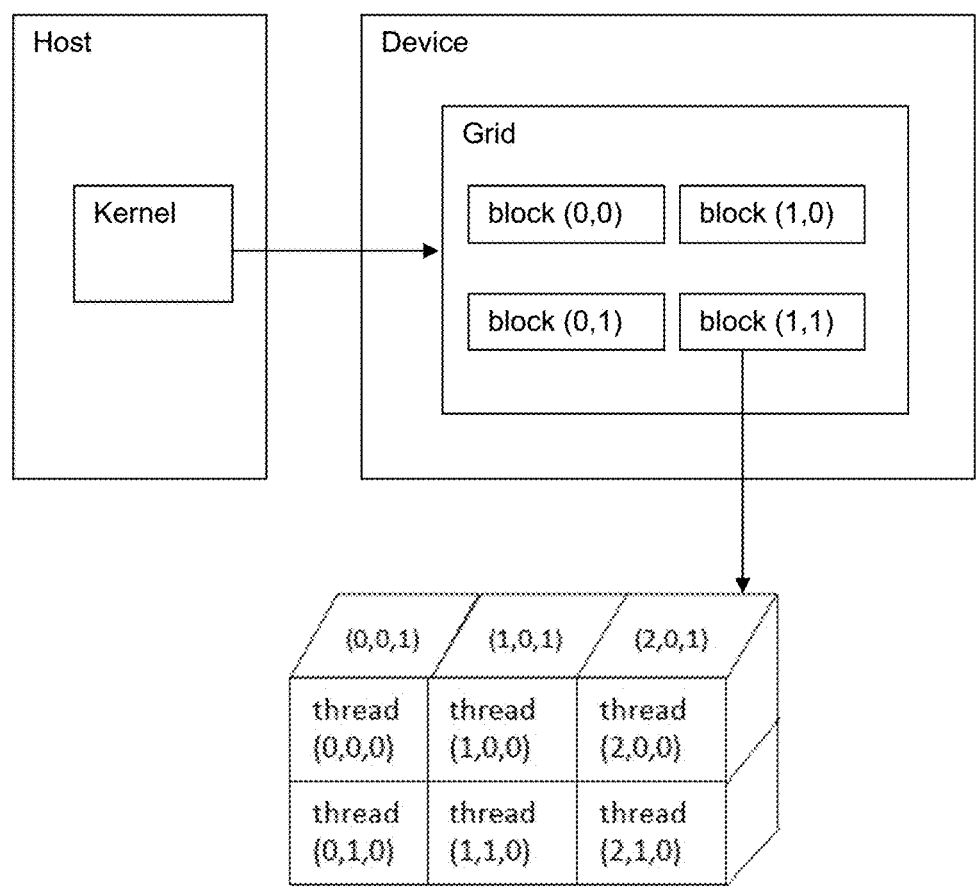
FIG. 1B is an example of CUDA grid organization.

FIG. 1A is an overview of CUDA Memory Model and FIG. 1B is an example of CUDA grid organization. Modern GPUs contain several multi-processors; each consists of many processor cores and high speed memory. GPU architecture supports Single Program Multiple Data (SIMD) programming model which allows programmers to easily implement the parallel algorithms on GPUs. The programmer can write single program which encompasses both the host (CPU) code and device (GPU) code. The NVIDIA compiler separates the host and device code which are then compiled by the host compiler and device compiler, respectively. The host code can transfer data to and from the GPU global memory. The GPU acts as a co-processor to the CPU and is also called General Purpose GPU (GPGPU). GPGPUs can perform calculations by launching a large number of threads where each thread processes a small part of the information in a parallel fashion. This allows splitting a big task into small portions and executing them in parallel by CUDA threads to reduce the execution time which is necessary in MRI. Threads are organized in thread blocks, and CUDA grid contains multiple thread blocks. Threads, blocks and grids each have unique identification number. CUDA Programmer decides how many grids, blocks and threads need to be initialized which depends on the underlying problem to be solved. All the threads start by reading from the device global memory, perform the required calculation and write back the results in the global memory. Registers, shared memory, L1 cache, L2 cache, constant memory support the programmer to write an efficient code for GPGPU. An overview of CUDA memory model and CUDA grid organization is shown in FIG. 1.

Figure 2:
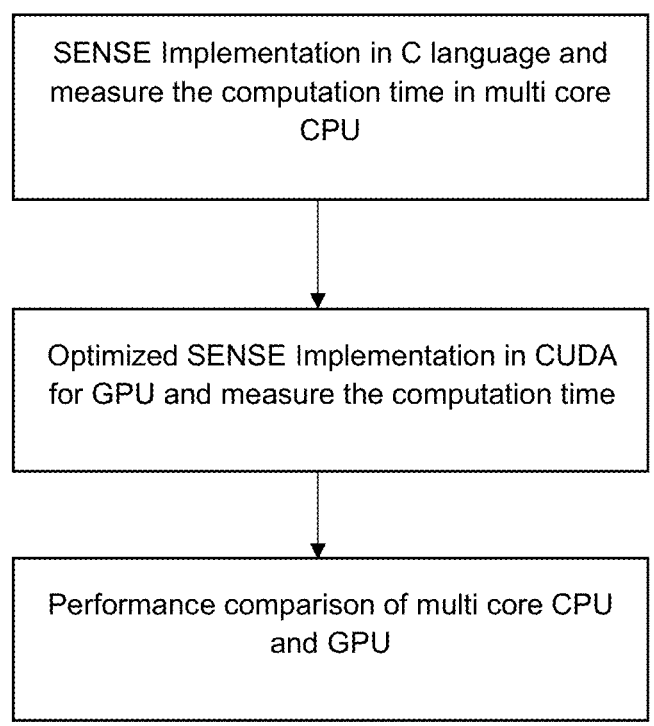
FIG. 2 is a diagram to show the main steps of the research work.

FIG. 2 is a diagram to show the main steps of the research work. According to an exemplary embodiment, SENSE algorithm is implemented in CUDA for GPU implementation. The software platform is MSDN 2010 and NVIDIA CUDA toolkit v6.5 is integrated in MSDN 2010. CUDA code is executed on GPU model NVIDIA GeForce GTX 660 with 960 CUDA cores, 2 GB memory with GDDR5 interface and 1033 MHz clock speed. The performance of SENSE algorithm on GPU is compared with its C language implementation for CPU core I7 with 2.9 GHz clock speed and 4 GB RAM. The work flow of this research is shown in FIG. 2.

The CPU implementation is very similar to the GPU implementation. The number of operations is exactly the same in both cases. The CPU implementation executes the code sequentially by using 'For' loops whereas GPU implementation breaks up the tasks and launches the threads to execute the tasks in parallel.

Figure 3:
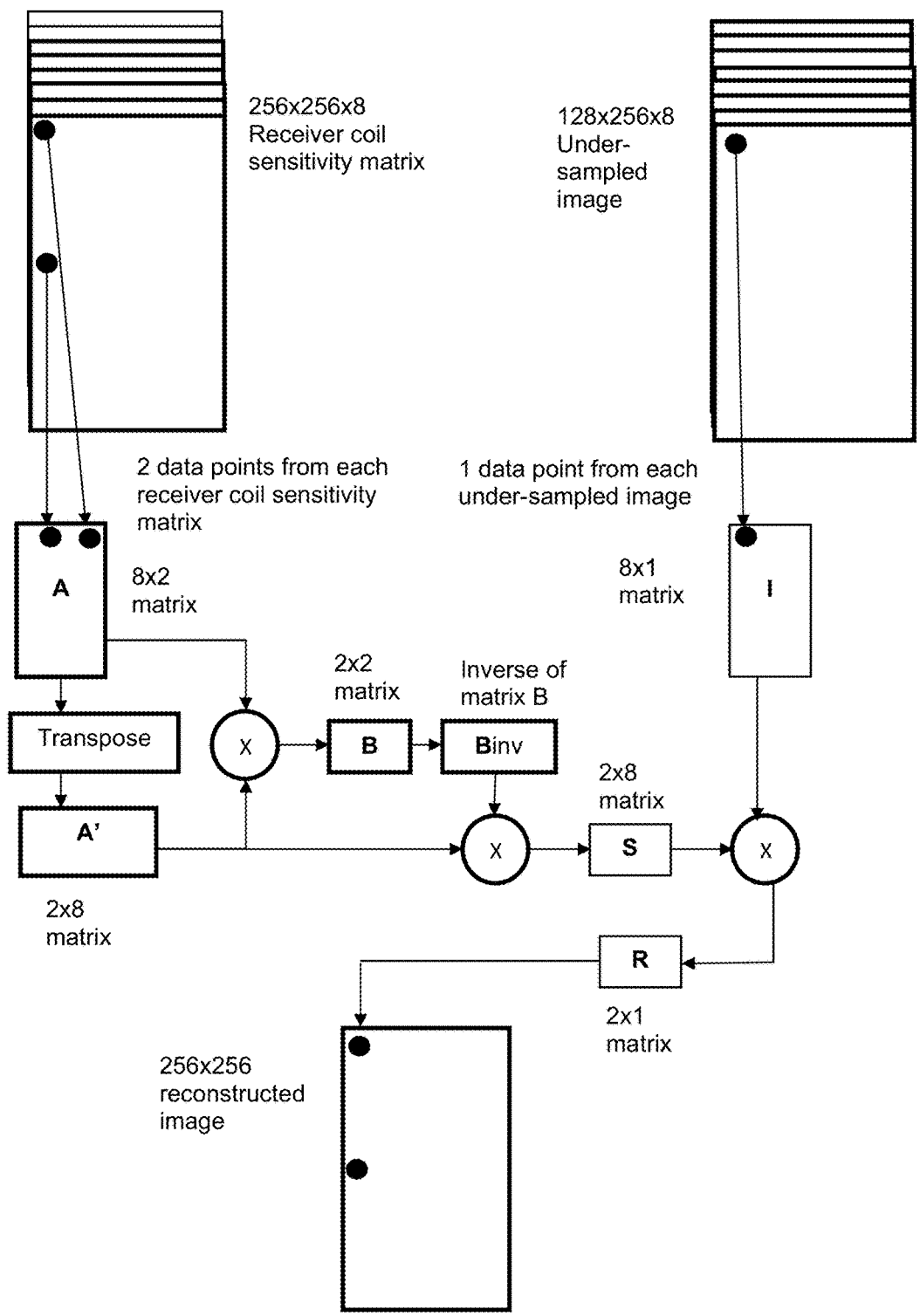
FIG. 3 shows the tasks of one thread in CUDA by using left inverse method to invert a 8×2 matrix.

FIG. 3 shows the tasks of one thread in CUDA by using left inverse method to invert 8×2 matrix. In the GPU, a number of threads are launched as per matrix inversions required for SENSE algorithm to attain the highest level of parallelism in GPUs. Each thread is capable of selecting pixel values from the coil sensitivity matrices and the under-sampled image, and performs the matrix inversion. Moreover, it performs other required multiplications as per requirement of the left inverse method and computes the values for the reconstructed image. FIG. 3 elaborates the working of a CUDA thread and the details of the left inverse method as used in this paper. The temporary variables for thread usage are stored in registers instead of global memory to reduce the reconstruction time. The total time of execution of SENSE algorithm including writing the output in GPU global memory is measured. There are different ways to measure the computation time in CUDA which includes CPU timers and CUDA events however CUDA events are more reliable than CPU timers. CUDA events are used in this work to calculate the computation time of SENSE algorithm in GPU. In C language, the execution of SENSE algorithm is measured in milliseconds by using time functions.

To monitor the reconstructed image quality for both the CPU and GPU implementations, we have used artefact power as a quantifying parameter. Mean SNR is calculated using pseudo multiple replica method.

The experiments are performed on two datasets acquired from 1.5 Tesla MRI Scanner which includes phantom and human head data. The dimensions of the aliased images (under-sampled by factor 2) are 128×256×2, 128×256×4, 128×256×6, and 128×256×8 for two, four, six and eight receiver coils respectively.

Figure 4A:
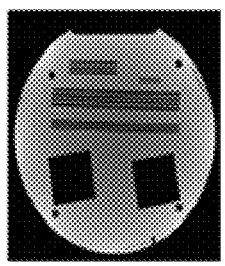
FIG. 4A is a fully sampled image.
Figure 4B:
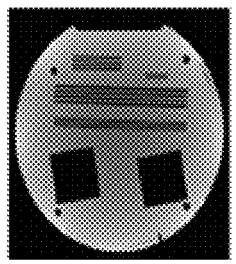
FIG. 4B to FIG. 4E are SENSE reconstructions by CPU using 2 receiver coils, 4 receiver coils, 6 receiver coils and 8 receiver coils.
Figure 4C:
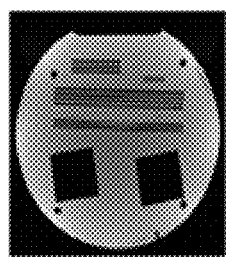
Figure 4D:
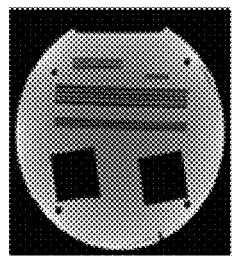
Figure 4E:
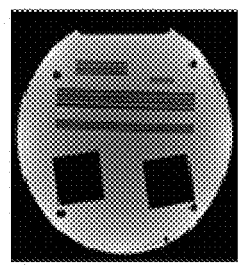
Figure 4F:
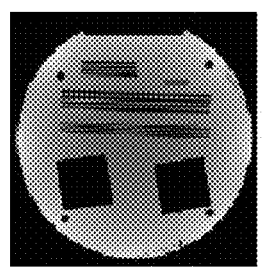
FIG. 4F to FIG. 4I are SENSE reconstructions by GPU using 2 receiver coils, 4 receiver coils, 6 receiver coils and 8 receiver coils.
Figure 4G:
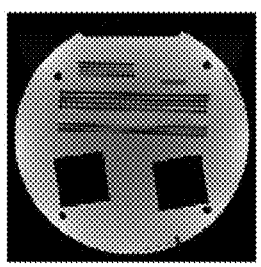
Figure 4H:
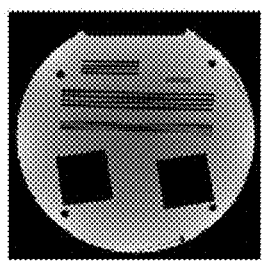
Figure 4I:
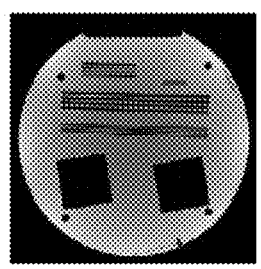
Figure 5A:
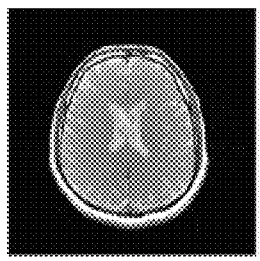
FIG. 5A is a fully sampled image.
Figure 5B:
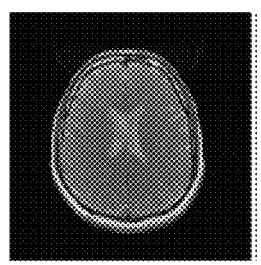
FIG. 5B to FIG. 5E are SENSE reconstructions by CPU using 2 receiver coils, 4 receiver coils, 6 receiver coils and 8 receiver coils.
Figure 5C:
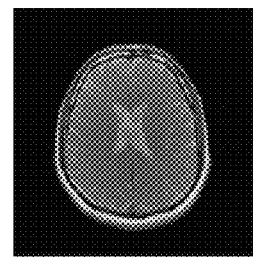
Figure 5D:
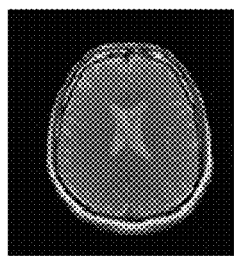
Figure 5E:
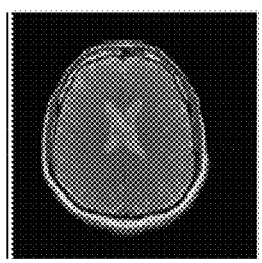
Figure 5F:
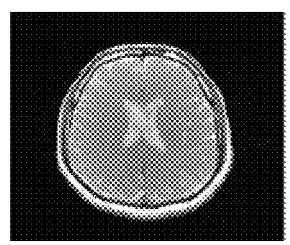
FIG. 5F to FIG. 5I are SENSE reconstructions by GPU using 2 receiver coils, 4 receiver coils, 6 receiver coils and 8 receiver coils.
Figure 5G:
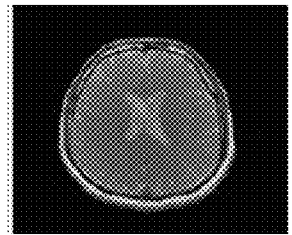
Figure 5H:
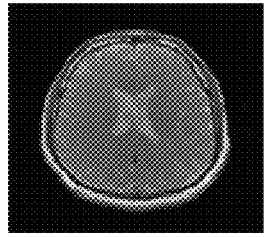
Figure 5I:
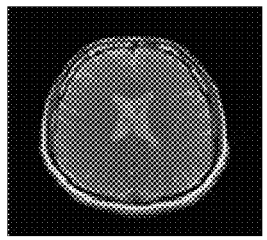

FIG. 4A is a fully sampled image, FIG. 4B to FIG. 4E are SENSE reconstructions (using AF=2) by CPU using the data acquired from 2 receiver coils, 4 receiver coils, 6 receiver coils and 8 coils, FIG. 4F to FIG. 4I are SENSE reconstructions (using AF=2) by GPU using the data acquired from 2 receiver coils, 4 receiver coils, 6 receiver coils and 8 receiver coils, FIG. 5A is a fully sampled image, FIG. 5B to FIG. 5E are SENSE reconstructions by CPU using the data acquired from 2 receiver coils, 4 receiver coils, 6 receiver coils and 8 receiver coils, FIG. 5F to FIG. 5I are SENSE reconstructions by GPU using the data acquired from 2 receiver coils, 4 receiver coils, 6 receiver coils and 8 receiver coils. FIGS. 4 and 5 show the SENSE reconstruction results obtained from both CPU and GPU implementations for phantom and human head data respectively. A summary of Artefact power of the CPU and GPU reconstructed images of both Phantom and human head data sets is shown in Table 1.

Figure 6A:
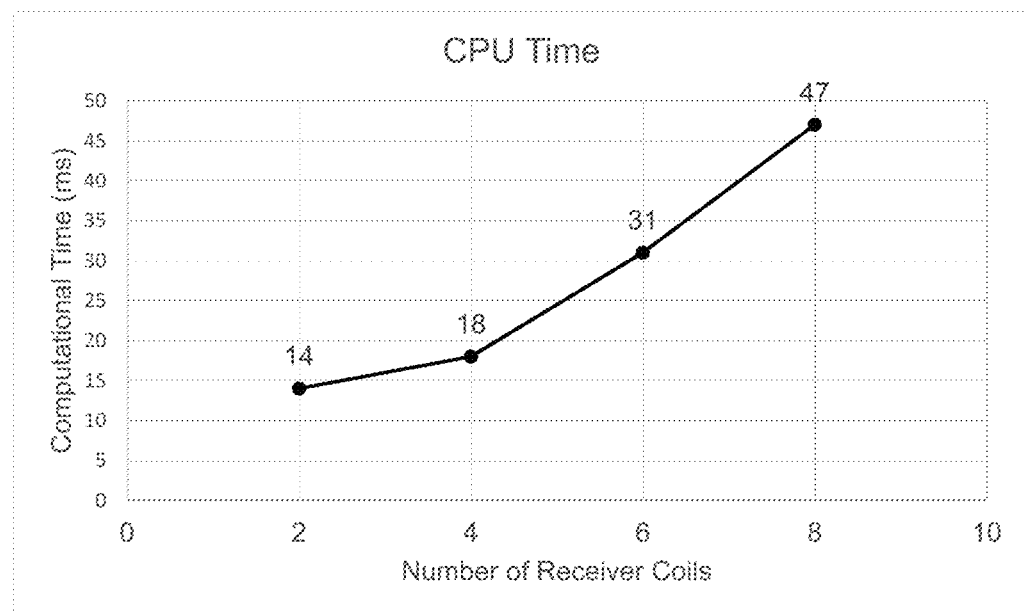
FIG. 6A is a SENSE Reconstruction time by CPU.
Figure 6B:
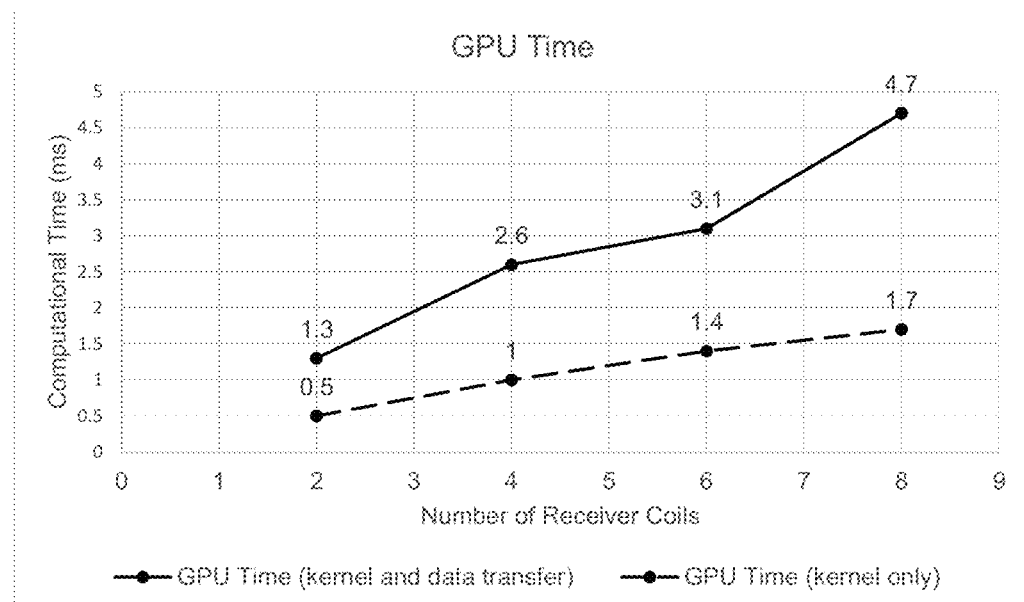
FIG. 6B is a SENSE Reconstruction time by GPU.

FIG. 6A is a SENSE reconstruction time by CPU, FIG. 6B is a SENSE Reconstruction time by GPU. In GPU implementation, most of the time is consumed in transferring the data from the host (CPU) memory to the device (GPU) memory. Therefore, two time measurements are performed as shown in Table 2: (1) Time taken exclusively for SENSE reconstruction by the kernel, (2) Time taken by the kernel and data transfer time (transferring input data from the host memory to the device memory and copying back the results from the device memory to the host memory). The results from Table 2 show that GPU attains approximately 18×~28× performance improvements in terms of time consumption by kernel for SENSE reconstruction algorithm exclusively, and approximately 7×~10× performance improvements for kernel as well as data transfer; this clearly demonstrates the efficiency of GPU over CPU because of parallel executions. FIG. 6 and Table 2 compare the time consumption by GPU and CPU for different number of receiver coils used for SENSE reconstruction.

Mean SNR is found using the SNR map method and is shown in Table 3 for phantom image and human head images respectively. The mean SNR in phantom reconstructed image is more than 39 dB and for human head data it is more than 29 dB which shows that the reconstructed MR images possess good SNR.

The results according to one exemplary embodiment show that GPU implementation of SENSE has reduced the computation time significantly as compared to CPU implementation as well as the quality of the reconstructed image is maintained. The results show that the computation time increases with the number of receiver coils because the required number of operations (multiplications and additions) is increased.

The exemplary embodiments present the implementation of SENSE algorithm on GPU using left inverse method. The performance comparison of GPU and the multi core CPU implementations is performed. The rectangular matrix inversion is implemented in CUDA for GPU implementation of SENSE. The results according to one exemplary embodiment show that GPU provides approximately 7×~28× reduction in computational time as compared to the CPU. The future work includes the performance comparison between CPU and GPU for higher acceleration factors in SENSE. Also, with new generations of graphic cards, it will be possible to further reduce the computation time with better optimized GPU programs.

TABLE 1

Summary of AP for phantom image and human head image for CPU and GPU implementation of SENSE algorithm from FIG. 4 and 5.

| No. of receiver coils | AP for Phantom image using multi-core CPU | AP for Phantom image using GPU | AP for Human Head image using multi-core CPU | AP for Human Head image using GPU |
|---|---|---|---|---|
| 2 | $3.07 \times 10^{-31}$ | $2.45 \times 10^{-13}$ | $3.07 \times 10^{-31}$ | $5.94 \times 10^{-13}$ |
| 4 | $2.69 \times 10^{-31}$ | $2.60 \times 10^{-13}$ | $2.70 \times 10^{-31}$ | $5.99 \times 10^{-13}$ |
| 6 | $2.34 \times 10^{-31}$ | $2.54 \times 10^{-13}$ | $2.34 \times 10^{-31}$ | $6.06 \times 10^{-13}$ |
| 8 | $9.35 \times 10^{-32}$ | $2.53 \times 10^{-13}$ | $9.35 \times 10^{-32}$ | $5.99 \times 10^{-13}$ |

TABLE 2

Performance Comparison of multi core CPU and GPU.

| No. of receiver coils (Acceleration factor = 2) | SENSE Computation time by multi-core CPU | SENSE computation time by GPU (kernel and data transfer) | SENSE computation time by GPU (kernel only) |
|---|---|---|---|
| 2 | 14 ms | 1.3 ms | 0.5 ms |
| 4 | 18 ms | 2.6 ms | 1.0 ms |
| 6 | 31 ms | 3.1 ms | 1.4 ms |
| 8 | 47 ms | 4.7 ms | 1.7 ms |

TABLE 3

Mean SNR for phantom image and human head image for CPU and GPU implementation of SENSE algorithm

| No. of receiver coils | Mean SNR for Phantom image using multi-core CPU (dB) | Mean SNR for Phantom image using GPU (dB) | Mean SNR for Human Head image using multi-core CPU (dB) | Mean SNR for Human Head image using GPU (dB) |
|---|---|---|---|---|
| 2 | 39.4721 | 39.4699 | 29.1428 | 29.2865 |
| 4 | 39.93 | 39.9256 | 28.9766 | 29.210 |
| 6 | 39.4723 | 39.4680 | 29.294 | 29.2858 |
| 8 | 39.4688 | 39.4742 | 29.2869 | 29.2876 |

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method for performing Magnetic Resonance Imaging (MRI), comprising:
   constructing a coil sensitivity encoding matrix;
   inversing of the coil sensitivity encoding matrix using a Left Inverse method;
   multiplying an inverse of the coil sensitivity encoding matrix with an under-sampled data matrix using a Graphical Processing Unit (GPU) residing on a host computer; and
   computing all independent tasks on the GPU in parallel by utilizing a maximum number of threads.

2. The method of claim 1, further comprising acquiring the under-sampled data by skipping k-space lines.

3. The method of claim 1 further comprising reconstructing Magnetic Resonance (MR) images by performing the inversion of coil sensitivity information.

4. The method of claim 1, further comprising reconstructing Magnetic Resonance (MR) images from the under-sampled data acquired from MRI scanner having multiple receiver coils.

5. The method of claim 4, wherein an acceleration factor is less than the number of the multiple receiver coils.

6. The method in claim 1, wherein MR signals are used and are acquired by Cartesian sampling.

7. A system, comprising:
   a Magnetic Resonance Image (MRI) scanner and the host computer comprising a Graphical Processing Unit (GPU),
   wherein the data acquired from the MRI scanner is processed by the GPU by:
   constructing a coil sensitivity encoding matrix;
   inversing of the coil sensitivity encoding matrix using a Left Inverse method;
   multiplying an inverse of the coil sensitivity encoding matrix with an under-sampled data matrix using the GPU residing on the host computer; and
   reconstructing Magnetic Resonance (MR) images comprising computing all independent tasks on the GPU in parallel by utilizing a maximum number of threads.

* * * * *